(12) United States Patent
Shibuya et al.

(10) Patent No.: US 9,503,035 B2
(45) Date of Patent: Nov. 22, 2016

(54) HIGH-FREQUENCY AMPLIFIER

(71) Applicant: TDK CORPORATION, Tokyo (JP)

(72) Inventors: Tomohiko Shibuya, Tokyo (JP); Atsushi Ajioka, Tokyo (JP); Atsushi Tsumita, Tokyo (JP); Sadaharu Yoneda, Tokyo (JP)

(73) Assignee: TDK CORPORATION, Tokyo (JP)

( * ) Notice: Subject to any disclaimer, the term of this patent is extended or adjusted under 35 U.S.C. 154(b) by 0 days.

(21) Appl. No.: 14/571,929

(22) Filed: Dec. 16, 2014

(65) Prior Publication Data

US 2015/0180419 A1 Jun. 25, 2015

(30) Foreign Application Priority Data

Dec. 18, 2013 (JP) ................................. 2013-261204
Dec. 11, 2014 (JP) ................................. 2014-251146

(51) Int. Cl.
| | | |
|---|---|---|
| *H03F 3/68* | (2006.01) | |
| *H03F 3/193* | (2006.01) | |
| *H03F 3/21* | (2006.01) | |
| *H03F 3/24* | (2006.01) | |
| *H03F 3/195* | (2006.01) | |

(52) U.S. Cl.
CPC .............. *H03F 3/193* (2013.01); *H03F 3/195* (2013.01); *H03F 3/211* (2013.01); *H03F 3/245* (2013.01); *H03F 2200/451* (2013.01); *H03F 2203/21106* (2013.01); *H03F 2203/21142* (2013.01)

(58) Field of Classification Search
CPC .......... H03F 1/56; H03F 3/195; H03F 3/211; H03F 3/245; H03F 3/04; H03F 3/06; H03F 3/191; H03F 3/68; H01L 23/66; H01L 23/647; H01L 27/0207; H01L 27/085; H01L 27/0605

USPC ......... 257/76, 330, 159, 234, 239, 907, 318; 330/250, 68, 296, 126, 295, 307, 286, 330/311, 302, 53
See application file for complete search history.

(56) References Cited

U.S. PATENT DOCUMENTS

| | | | |
|---|---|---|---|
| 8,710,928 B2 * | 4/2014 | Ng ....................... | H01L 29/4175 330/295 |
| 2013/0032817 A1 | 2/2013 | Miwa et al. | |
| 2015/0170986 A1* | 6/2015 | Szymanowski ..... | H01L 23/3121 330/295 |

FOREIGN PATENT DOCUMENTS

| | | |
|---|---|---|
| JP | A-2001-185966 | 7/2001 |
| JP | A-2006-19798 | 1/2006 |

(Continued)

*Primary Examiner* — Steven J Mottola
*Assistant Examiner* — Hafizur Rahman
(74) *Attorney, Agent, or Firm* — Oliff PLC

(57) ABSTRACT

There is provided a high-frequency amplifier including a divider, a plurality of amplifiers for amplifying a high-frequency signal distributed by the divider and outputting the amplified high-frequency signal, a combiner for combining amplified high-frequency signals, a base substrate, a conductor pattern that is connected to a ground end of each of the amplifiers, and a ground electrode. Each of the conductor patterns has a first conductive portion. A slot is disposed between the two conductor patterns connected to the corresponding adjacent amplifiers. Between the adjacent amplifiers, two vias are formed so that the slot is sandwiched between the vias. One of the two conductor patterns is connected to the ground electrode via one of the two vias, and the other one of the conductor patterns is connected to the ground electrode via the other one of the two vias.

12 Claims, 9 Drawing Sheets

(56) References Cited

FOREIGN PATENT DOCUMENTS

| JP | A-2010-177904 | 8/2010 |
| JP | 2011044812 A * | 3/2011 |
| JP | A-2011-44812 | 3/2011 |
| JP | A-2013-38121 | 2/2013 |
| JP | A-2013-65938 | 4/2013 |

* cited by examiner

HIGH-FREQUENCY AMPLIFIER

BACKGROUND

The present invention relates to a high-frequency amplifier for amplifying an input high-frequency signal.

In recent years, high-frequency amplifiers including a Field Effect Transistor (FET) using a gallium arsenide (GaAs) process, a silicon-germanium (SiGe) process, a Complementary Metal Oxide Semiconductor (CMOS) process, or the like have been used for terrestrial microwave communication and satellite communication so as to transmit a radio signal in a microwave range of 1 GHz or higher. Such a high-frequency amplifier generally amplifies an input high-frequency signal using a plurality of amplifiers, combines high-frequency signals amplified by these amplifiers, and outputs a resultant signal so as to obtain high power. These amplifiers in such a high-frequency amplifier each include a group of a plurality of FET elements or FETs, and are arranged in parallel so as to perform power amplification. In such a configuration, a divider distributes an input high-frequency signal equally among a plurality of amplifiers and a combiner combines high-frequency signals output from these amplifiers and outputs a resultant signal.

In current years, F-class amplification is employed in high-frequency amplifiers and the increase in power efficiency is achieved with harmonics. A high-frequency amplifier employing the F-class amplification is a broadband high-frequency amplifier that can handle harmonics such as second and third harmonics of frequencies higher than a target frequency and uses zero power for all harmonics by short-circuiting even harmonics such as a second harmonic and opening odd harmonics such as a third harmonic. This leads to high power efficiency. However, the second and third harmonics have short wavelengths and easily propagate through various signal lines. In order to prevent such a harmonic from outputting from the output end of a combiner, a circuit for reflecting the harmonic is provided. However, for example, when an input high-frequency signal is distributed between two parallel-connected amplifiers by a divider and signals output from these two amplifiers are combined by a combiner, a loop path of the output end of one of the amplifiers, the line of the combiner, the output end of the other one of the amplifiers, the input end of the other one of the amplifiers, the line of the divider, the input end of one of the amplifiers, and the output end of one of the amplifiers is generated. In this loop, oscillation may occur. Therefore, Patent Reference 1 discloses the method of preventing the occurrence of loop oscillation between the input end of a high-frequency amplifier and an amplifier.

FIG. 9 is a schematic diagram of a high-frequency amplifier $1x$ disclosed in Patent Reference 1. The high-frequency amplifier $1x$ illustrated in FIG. 9 includes a divider substrate $40x$, an amplification circuit substrate $50x$, and a combiner substrate $60x$. The divider substrate $40x$ has a conductor pattern including a plurality of branching terminals $21x$, $22x$, $23x$, and $24x$ for distributing a high-frequency signal input into an input terminal $20x$. The amplification circuit substrate $50x$ amplifies high-frequency signals output from the branching terminals $21x$, $22x$, $23x$, and $24x$. The combiner substrate $60x$ combines high-frequency signals output from the amplification circuit substrate $50x$. In the conductor pattern of the divider substrate $40x$, resistive pattern portions $41x$, $42x$, $43x$, and $44x$ are formed between the input terminal $20x$ and the branching terminals $21x$, $22x$, $23x$, and $24x$, respectively, on an insulating substrate. The resistive pattern portions $41x$, $42x$, $43x$, and $44x$ between the input terminal $20x$ of the high-frequency amplifier $1x$ and the amplification circuit substrate $50x$ attenuate high-frequency loop signals and prevent the occurrence of loop oscillation.

PRIOR ART REFERENCE

Patent Reference

Patent Reference 1: Japanese Unexamined Patent Application Publication No. 2011-44812

SUMMARY

For example, when an input high-frequency signal is distributed between two parallel-connected amplifiers including source-grounded FETs by a divider and signals output from these two amplifiers are combined by a combiner, a loop path of the output end (FET's drain) of one of the amplifiers, the line of the combiner, the output end (FET's drain) of the other one of the amplifiers, the input end (FET's gate) of the other one of the amplifiers, the line of the divider, the input end (FET's gate) of one of the amplifiers, and the output end (FET's drain) of one of the amplifiers is generated. In this case, since a high impedance is obtained between the drain and gate of each FET, a high-frequency signal does not propagate through the loop path.

The high-frequency signal that has flowed from the output end of one of the amplifiers to the output end of the other one of the amplifiers easily passes through a path from the drain to source of an FET. Accordingly, the high-frequency signal propagates through a loop path (hereinafter referred to as "an oscillation loop path between amplifiers") of the output end (FET's drain) of one of the amplifiers, the line of the combiner, the output end (FET's drain) of the other one of the amplifiers, the ground end (FET's source) of the other one of the amplifiers, the ground end (FET's source) of one of the amplifiers, and the output end (FET's drain) of one of the amplifiers. However, it is difficult to prevent the occurrence of oscillation due to this loop with the method disclosed in Patent Reference 1. When an amplifier amplifies a high-frequency signal, heat is produced. Accordingly, when the spacing between adjacent ones of a plurality of amplifiers in a high-frequency amplifier is reduced for the sake of the size reduction of the high-frequency amplifier, thermal runaway occurs and the electric characteristic of the high-frequency amplifier is deteriorated. Although a case where an FET is used as an amplifier has been described, this difficulty also occurs in a case where a Hetero-junction Bipolar Transistor (HBT) or another transistor is used as an amplifier.

The present invention has been made in view of the above-described difficulty in the related art, and it is an object of the present invention to provide a high-frequency amplifier capable of preventing the occurrence of loop oscillation between an amplifier and a combiner and the deterioration of an electric characteristic due to thermal runaway.

A first feature of a high-frequency amplifier according to the present invention is that the high-frequency amplifier includes a divider for distributing an input high-frequency signal, a plurality of parallel-connected amplifiers for amplifying a high-frequency signal distributed by the divider and outputting the amplified high-frequency signal, a combiner for combining high-frequency signals amplified by the amplifiers, a substrate on which the amplifiers are disposed, a conductor pattern connected to a ground end of each of the amplifiers, and a ground electrode. The conductor pattern has a first conductive portion extending in a direction in which the amplifiers are adjacent to each other. A slot is disposed between two conductor patterns connected to corresponding adjacent ones of the amplifiers. Between the adjacent amplifiers, two vias passing through the substrate are formed so that the slot is sandwiched between the vias. One of the two conductor patterns connected to the corresponding adjacent amplifiers is connected to the ground electrode via one of the two vias. The other one of the two conductor patterns connected to the corresponding adjacent amplifiers is connected to the ground electrode via the other one of the two vias.

According to the present invention having the above-described feature, one of high-frequency signals output from one of the adjacent amplifiers flows to the output end of the other one of the amplifiers via the line of the combiner and then flows to the ground end of the other one of the amplifiers. The slot prevents this high-frequency signal from flowing to one of the amplifiers. The high-frequency signal flows to the ground electrode via the conductor pattern and the via connected to the ground end of the other one of the amplifiers.

As a result, the flow of a high-frequency signal through an oscillation loop path between the above-described amplifiers can be prevented and the occurrence of loop oscillation can be prevented. Heat produced by the amplifiers is dissipated to the ground electrode via the conductor patterns and the vias between the adjacent amplifiers. As a result, the deterioration of the electric characteristics of the amplifiers due to thermal runaway can be prevented.

A second feature of a high-frequency amplifier according to the present invention is that the conductor pattern has, between the adjacent amplifiers, a second conductive portion extending in a direction different from the direction in which the first conductive portion extends, second conductive portions of the two conductor patterns connected to the corresponding ones of the adjacent amplifiers extend in directions away from each other, and the second conductive portions are connected to the corresponding vias.

In order to form two vias, the spacing between the two vias is needed. According to the present invention having the above-described features, however, since the second conductive portions of the two conductor patterns that are connected to the corresponding amplifiers extend in directions away from each other that are different from the direction in which the amplifiers are adjacent to each other and the first conductive portions extend and the vias are connected to the corresponding second conductive portions, the two vias can be formed even if the spacing between the adjacent amplifiers is reduced. Accordingly, the spacing between the adjacent amplifiers can be reduced and a small high-frequency amplifier can be provided.

A third feature of a high-frequency amplifier according to the present invention is that a length of the slot is substantially equal to or less than a half-wavelength of a high-frequency signal used.

According to the present invention having the above-described features, since the length of the slot is set to the length substantially equal to or less than a half-wavelength of the high-frequency signal used, the slot does not resonate at the frequency of the high-frequency signal used.

As a result, even when the slot is disposed, oscillation does not occur.

A fourth feature of a high-frequency amplifier according to the present invention is that the high-frequency amplifier further includes in parallel with the slot a resistance element connected between the two conductor patterns connected to the corresponding adjacent amplifiers and the adjacent amplifiers are connected to each other via the conductor patterns and the resistance element.

According to the present invention having the above-described features, since in parallel with the slot the resistance element is connected between the two conductor patterns that are connected to the corresponding adjacent amplifiers, the resistance element is present on an oscillation loop path between the amplifiers. Accordingly, a high-frequency signal flowing through the oscillation loop path between the amplifiers passes through the resistance element.

As a result, the high-frequency signal flowing through the oscillation loop path between the amplifiers is attenuated at the resistance element and the occurrence of loop oscillation can be prevented for high-frequency signals in all frequency ranges.

A fifth feature of a high-frequency amplifier according to the present invention is that the high-frequency amplifier further includes in parallel with the slot a resonance circuit connected between the two conductor patterns connected to the corresponding adjacent amplifiers, the adjacent amplifiers are connected to each other via the conductor patterns and the resonance circuit, and the resonance circuit forms a low-pass filter.

According to the present invention having the above-described features, the connected resonance circuit is provided in parallel with the slot and the adjacent amplifiers are connected to each other via the conductor patterns and the resonance circuit. Accordingly, the resonance circuit is present on an oscillation loop path between the amplifiers, and a high-frequency signal flowing through the oscillation loop path between the amplifiers passes through the resonance circuit.

Since the resonance circuit forms a low-pass filter, a harmonic component in the high-frequency signal flowing through the oscillation loop path between the amplifiers can be attenuated. As a result, the occurrence of loop oscillation due to a harmonic component can be prevented.

A sixth feature of a high-frequency amplifier according to the present invention is that the high-frequency amplifier further includes in parallel with the slot a resonance circuit connected between the two conductor patterns connected to the corresponding adjacent amplifiers, the adjacent amplifiers are connected to each other via the conductor patterns and the resonance circuit, the resonance circuit forms a notch filter, and a resonance point of the notch filter is a frequency of a high-frequency signal used.

According to the present invention having the above-described features, the connected resonance circuit is provided in parallel with the slot and the adjacent amplifiers are connected to each other via the conductor patterns and the resonance circuit. Accordingly, the resonance circuit is present on an oscillation loop path between the amplifiers, and a high-frequency signal flowing through the oscillation loop path between the amplifiers passes through the resonance circuit.

The resonance circuit forms a notch filter, and the resonance point of the notch filter is the frequency of a high-frequency signal used. Accordingly, a frequency component in the high-frequency signal used is attenuated by the resonance circuit. As a result, the occurrence of loop oscillation due to a frequency component in a high-frequency signal used can be further prevented.

A seventh feature of a high-frequency amplifier according to the present invention is that an insulating material with which an inside of the slot is filled has a dielectric constant lower than that of an insulating material used around the slot.

According to the present invention having the above-described features, since the insulating material with which the inside of the slot is filled has a dielectric constant lower than that of the insulating material used around the slot, the level of insulation against a high-frequency signal flowing through the oscillation loop path between the amplifiers is increased.

As a result, the occurrence of loop oscillation can be further prevented. In addition, since the level of insulation inside the slot is high, loop oscillation does not occur even when the width of the slot is reduced. The size reduction of a high-frequency amplifier can be therefore achieved.

According to the present invention, there can be provided a high-frequency amplifier capable of preventing the occurrence of loop oscillation between an amplifier and a combiner and the deterioration of an electric characteristic due to thermal runaway.

DETAILED DESCRIPTION OF EMBODIMENTS

Preferred embodiments for implementing the present invention will be described in detail with reference to the drawings. The following description of the embodiments is not intended to limit the present invention. The constituent elements described below include those that a person skilled in the art could easily assume, those that are substantially the same as the constituent elements, or those that fall within the scope of equivalents of the constituent elements. The constituent elements described below may be combined as appropriate. Furthermore, the constituent elements may be omitted, replaced, or modified without departing from the spirit of the present invention.

First Embodiment

Figure 1:
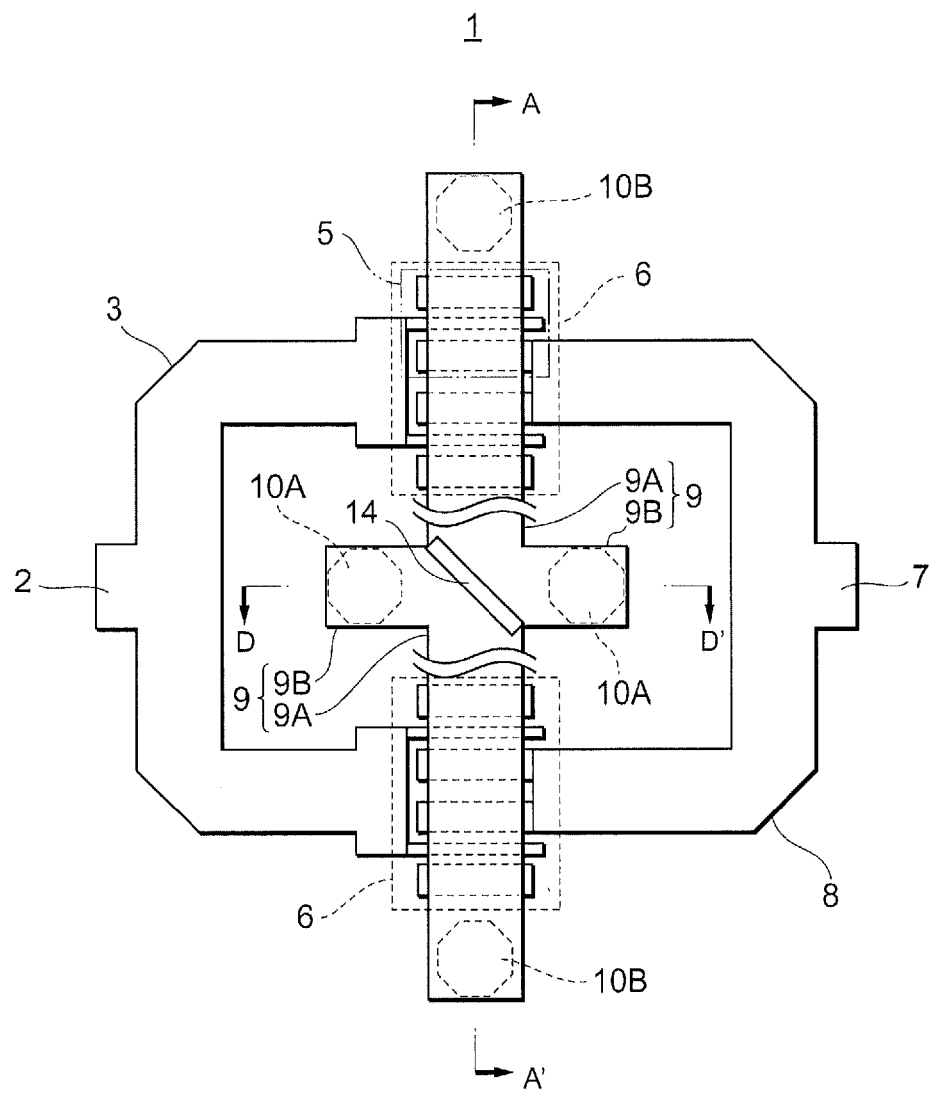
FIG. 1 is a diagram illustrating the layout of a high-frequency amplifier according to a first embodiment.
Figure 2:
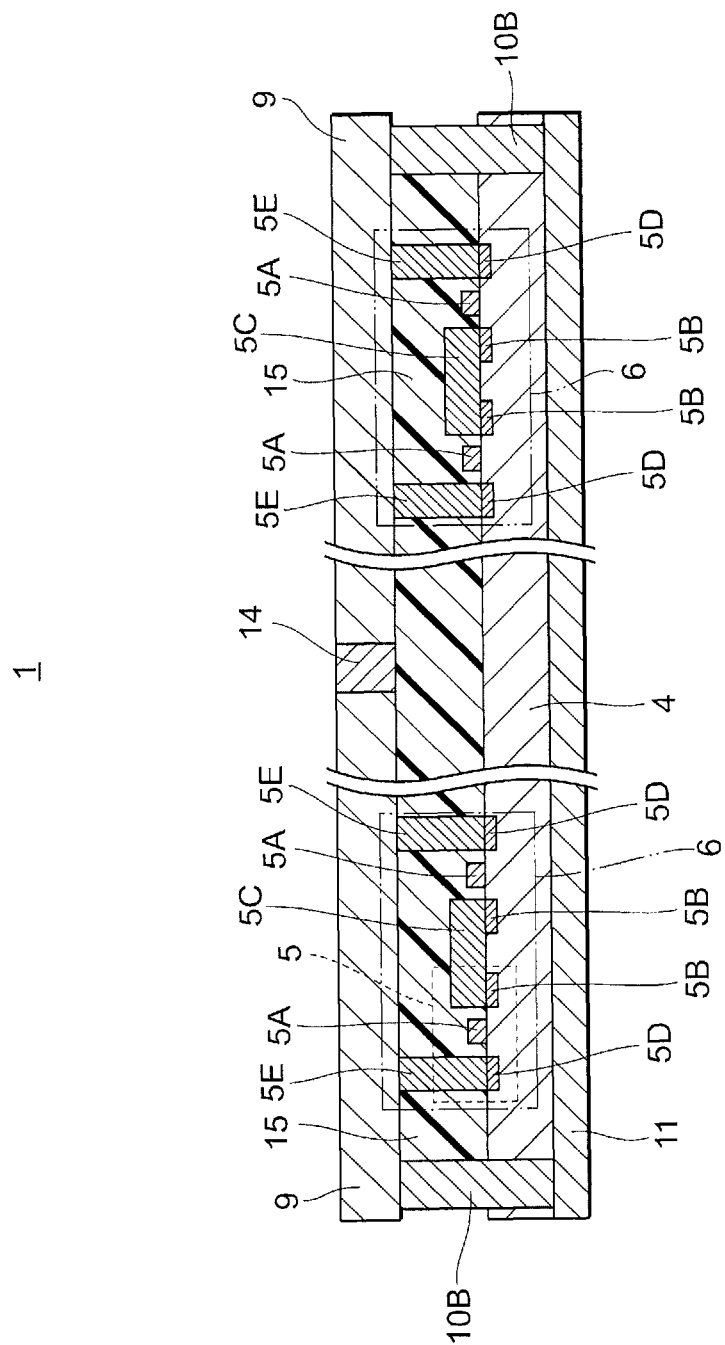
FIG. 2 is a cross-sectional view taken along the line A-A' of FIG. 1.
Figure 3:
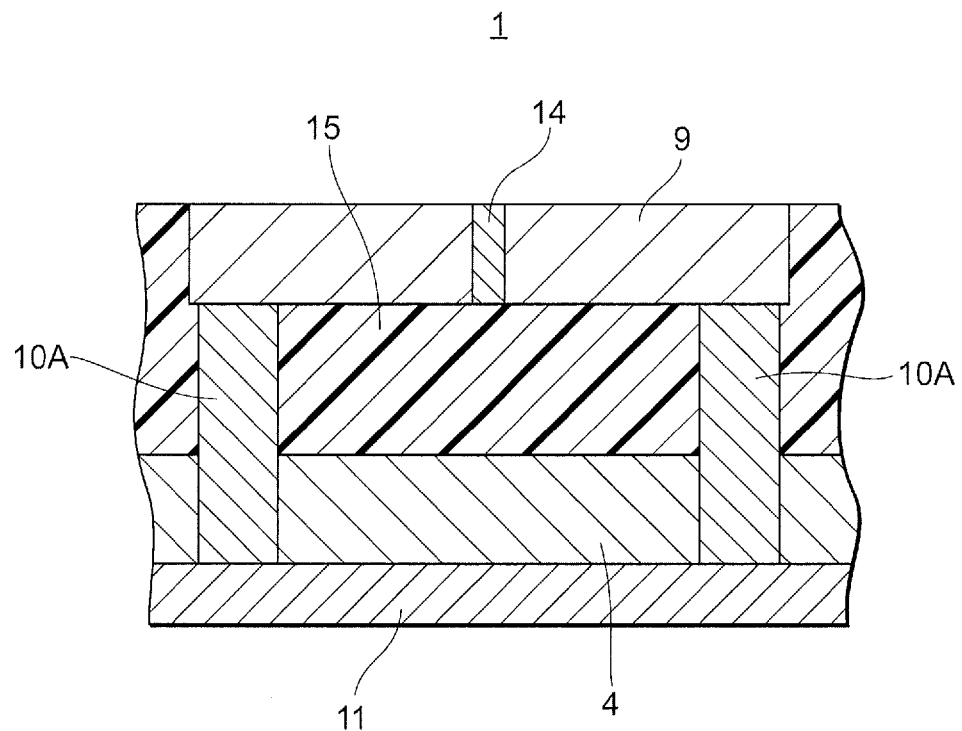
FIG. 3 is a cross-sectional view taken along the line D-D' of FIG. 1.

FIG. 1 is a semiconductor layout chart illustrating the entire configuration of a high-frequency amplifier 1 according to the first embodiment. FIG. 2 is a cross-sectional view taken along the line A-A' of FIG. 1. FIG. 3 is a cross-sectional view taken along the line D-D' of FIG. 1. The high-frequency amplifier 1 includes a divider 3 for distributing a high-frequency signal input from an input end 2, a plurality of parallel-connected amplifiers 6 for amplifying a distributed high-frequency signal and outputting the amplified high-frequency signal, a combiner 8 for combining high-frequency signals amplified by the amplifiers 6 and outputting a resultant signal from an output end 7, a base substrate 4 on which the amplifiers 6 are disposed, a conductor pattern 9 that is connected to the ground end of each of the amplifiers 6, and a ground electrode 11. Each of the amplifiers 6 includes a plurality of transistors 5. The amplifiers 6 are connected to the divider 3 and the combiner 8 and are connected in parallel to the input end 2 and the output end 7. The divider 3, the amplifiers 6, and the combiner 8 are formed on one surface of the base substrate 4. The ground electrode 11 is formed on the other surface of the base substrate 4.

Each of the conductor patterns 9 has a first conductive portion 9A that extends in a direction in which the amplifiers 6 are adjacent to each other and a second conductive portion 9B that extends between the adjacent amplifiers 6 in a direction different from the extending direction of the first conductive portion 9A. The second conductive portions 9B of the two conductor patterns 9 that are connected to the corresponding adjacent amplifiers 6 extend in directions away from each other.

In the high-frequency amplifier 1, a slot 14 is disposed between the two conductor patterns 9 that are connected to the corresponding adjacent amplifiers 6. Between the adjacent amplifiers 6, the slot 14 is sandwiched between two vias 10A that pass through the base substrate 4. The via 10A is connected to the second conductive portion 9B. One of the two conductor patterns 9 that are connected to the corresponding adjacent amplifiers 6 is connected to the ground electrode 11 via one of the two vias 10A. The other one of the two conductor patterns 9 that are connected to the corresponding adjacent amplifiers 6 is connected to the ground electrode via the other one of the two vias 10A. Portion of the conductor pattern 9 opposite to the adjacent amplifiers is connected to the ground electrode 11 via via 10B that passes through the base substrate 4. As illustrated in FIGS. 1, 2, and 3, the slot 14 is disposed between the two conductor patterns 9 so as to prevent the electric connection between the adjacent amplifiers 6 via the conductor patterns 9. Between the adjacent amplifiers 6, the two conductor patterns 9 are point symmetric with respect to the slot 14 and the two vias 10A are point symmetric with respect to the slot 14. The slot 14 has a function of electrically attenuating a high-frequency signal. As illustrated in FIG. 1, a void having a rectangular shape when viewed in plan is disposed at an angle with respect to a direction in which the first conductive portions 9A extend and the slot 14 is formed by filling the void with an insulating material. The insulating material is the same as an insulating material 15 to be described later.

The transistors 5 are field-effect transistors. Each of the amplifiers 6 is formed by connecting the transistors 5 in parallel for multiple stages. As illustrated in FIG. 2, each of the transistors 5 includes a gate electrode 5A, a drain 5B, a drain electrode 5C, a source 5D, and a source electrode 5E on the base substrate 4. The divider 3 and the gate electrode 5A are connected. The drain electrode 5C and the combiner 8 are connected. The source electrode 5E and the conductor pattern 9 are connected. The gate electrode 5A corresponds to the input end of the amplifier 6. The drain electrode 5C corresponds to the output end of the amplifier 6. The source electrode 5E corresponds to the ground end of the amplifier 6.

The surrounding portions of the gate electrodes 5A, the drain electrodes 5C, the source electrodes 5E, the vias 10A, and the vias 10B are filled with the insulating material 15 such as polyimide or silicon oxide.

Next, the operation of the high-frequency amplifier 1 will be described with reference to FIG. 1. When a high-frequency signal is input into the high-frequency amplifier 1, the divider 3 distributes the high-frequency signal between two portions. The distributed high-frequency signals are input into the input ends of the corresponding amplifiers 6 and are amplified. The amplified high-frequency signals are output from the corresponding amplifiers 6 to the output end via the combiner 8. However, not only a high-frequency signal to be output to the output end 7 but also a high-frequency signal to be flowed to the other line (the line connected to the other one of the adjacent amplifiers 6) of the combiner 8 and a high-frequency signal reflected from a matching circuit (not illustrated) connected to the combiner 8 on the side of the output end 7 are present at the combiner 8. These high-frequency signals flow through the other line of the combiner 8 and return to the output ends of the adjacent amplifiers 6. The high-frequency signals that have returned to the output ends 7 of the adjacent amplifiers 6 flow from the drains to the sources (ground ends) of the transistors 5 in the amplifiers 6 and then flow to the ground electrode 11 via the conductor patterns 9 and the vias 10A. Since the slot 14 is disposed between the two conductor patterns 9 that are connected to the corresponding adjacent amplifiers 6 and the adjacent amplifiers 6 are not electrically connected to each other via the conductor patterns 9 in the high-frequency amplifier 1, the returned high-frequency signals are prevented from flowing to one of the adjacent amplifiers 6 because of the presence of the slot 14 and flow to the ground electrode 11. As a result, the returned high-frequency signals are attenuated and the occurrence of loop oscillation can be prevented.

When the amplifiers 6 amplify high-frequency signals, heat is always produced. However, the heat produced by the amplifiers is dissipated from the ground electrode 11 via the conductor patterns 9 and the vias 10A between the adjacent amplifiers. Accordingly, the deterioration of the electric characteristic of the amplifiers 6 due to thermal runaway can be prevented. The improvement of a heat dissipation capability is generally proportional to the thickness and perimeter of a via and the number of vias. Accordingly, when the number of vias for connecting the conductor pattern 9 and the ground electrode 11 is increased in the high-frequency amplifier 1, a heat dissipation capability is improved. Since each of the conductor patterns 9 and the ground electrode 11 are connected not only via the via 10A but also via the via 10B, the high-frequency amplifier 1 has a good heat dissipation capability.

As described above, the high-frequency amplifier 1 according to the first embodiment includes the divider 3 for distributing an input high-frequency signal, the parallel-connected amplifiers 6 for amplifying a high-frequency signal distributed by the divider 3 and outputting the amplified signal, the combiner 8 for combining high-frequency signals amplified by the amplifiers 6, the base substrate 4 on which the amplifiers 6 are disposed, the conductor pattern 9 that is connected to the ground end of each of the amplifiers 6, and the ground electrode 11. Each of the conductor patterns 9 has the first conductive portion 9A extending in a direction in which the amplifiers 6 are adjacent to each other. The slot 14 is disposed between the two conductor patterns 9 that are connected to the corresponding adjacent amplifiers 6. Between the adjacent amplifiers 6, the vias 10A passing through the base substrate 4 are disposed so that the slot 14 is sandwiched between the vias 10A. One of the two conductor patterns 9 that are connected to the corresponding adjacent amplifiers 6 is connected to the ground electrode 11 via one of the two vias 10A. The other one of the two conductor patterns 9 that are connected to the corresponding adjacent amplifiers is connected to the ground electrode 11 via the other one of the two vias 10A.

One of high-frequency signals output from one of the adjacent amplifiers 6 flows to the output end of the other one of the amplifiers 6 via the line of the combiner 8 and then flows to the ground end of the other one of the amplifiers 6. According to the high-frequency amplifier 1, the slot 14 prevents this high-frequency signal from flowing to one of the amplifiers 6. The high-frequency signal flows to the ground electrode via the conductor pattern 9 and the via 10A which are connected to the ground end of the other one of the amplifiers 6. As a result, the flow of a high-frequency signal through an oscillation loop path between the amplifiers 6 can be prevented and the occurrence of loop oscillation can be prevented. In addition, heat produced by the amplifiers 6 is dissipated to the ground electrode 11 via the conductor patterns 9 and the vias 10A between the adjacent amplifiers. As a result, the deterioration of the electric characteristic of the amplifiers 6 due to thermal runaway can be prevented.

In the high-frequency amplifier 1 according to the first embodiment, the conductor pattern 9 has the second conductive portion 9B that extends in a direction different from the extending direction of the first conductive portion 9A. The second conductive portions 9B of the two conductor patterns 9 that are connected to the corresponding adjacent amplifiers 6 extend in directions away from each other. The via 10A is connected to the second conductive portion 9B. In order to form two vias, the spacing between the two vias is needed. In the high-frequency amplifier 1 according to the first embodiment, however, since the second conductive portions 9B of the two conductor patterns 9 connected to the corresponding amplifiers 6 extend in directions away from each other that are different from the direction in which the amplifiers 6 are adjacent to each other and the first conductive portions 9A extend and the via 10A is connected to the second conductive portion 9B, the two vias 10A can be formed even if the spacing between the adjacent amplifiers 6 is reduced. Accordingly, the spacing between the adjacent amplifiers 6 can be reduced and a small high-frequency amplifier can be provided.

In the high-frequency amplifier 1 according to this embodiment, a void portion corresponding to the slot 14 is filled with an insulating material. However, the slot 14 may be a void portion that is not filled with an insulating material. In the high-frequency amplifier 1, the slot 14 is disposed at an angle to the direction in which the first conductive portions 9A extend. However, the slot 14 may be disposed so that the long side of the slot 14 is perpendicular to the extending direction of the first conductive portions 9A. In the high-frequency amplifier 1, the slot 14 has a rectangular shape when viewed in plan, but may have another shape.

In the high-frequency amplifier 1 according to this embodiment, the slot 14 is disposed between the two conductor patterns 9 connected to the corresponding adjacent amplifiers 6 so that the adjacent amplifiers 6 are not electrically connected to each other via the conductor patterns 9. However, parts of the two conductor patterns 9 may be electrically connected to each other around the slot 14 and the adjacent amplifiers 6 may be electrically connected to each other via the conductor patterns 9. Even in that case, the slot 14 has a function of electrically attenuating a high-frequency signal. Accordingly, in a case where the slot 14 is disposed between the two conductor patterns 9, the flow of a high-frequency signal through an oscillation loop path between the amplifiers 6 can be prevented and the occurrence of loop oscillation can be prevented.

For the simplification of explanation, a common configuration example including the divider 3 for distributing a high-frequency signal between two portions, the two amplifiers 6, and the combiner 8 for combining two distributed paths has been described in this embodiment. However, a layout configuration other than that of a high-frequency amplifier according to this embodiment may be employed. The transistors 5 included in the amplifiers 6 may not be field-effect transistors according to the first embodiment, and may be, for example, bipolar transistors. Although the high-frequency amplifier 1 according to this embodiment has a semiconductor layout, the high-frequency amplifier may be configured with modules.

Second Embodiment

In the second embodiment, only an additional configuration part to the first embodiment will be described. More specifically, in a high-frequency amplifier according to the second embodiment, the long side of the slot 14 having a rectangular shape when viewed in plan in FIG. 1 is equal to or less than a half-wavelength of a high-frequency signal used. When the slot 14 is used, resonance generally occurs at the frequency of a high-frequency signal used and oscillation occurs at the slot 14. However, by setting the length of the slot to the length equal to or less than a half-wavelength of the high-frequency signal used, resonance does not occur. Accordingly, even when the slot 14 is disposed, oscillation does not occur.

Third Embodiment

Figure 4:
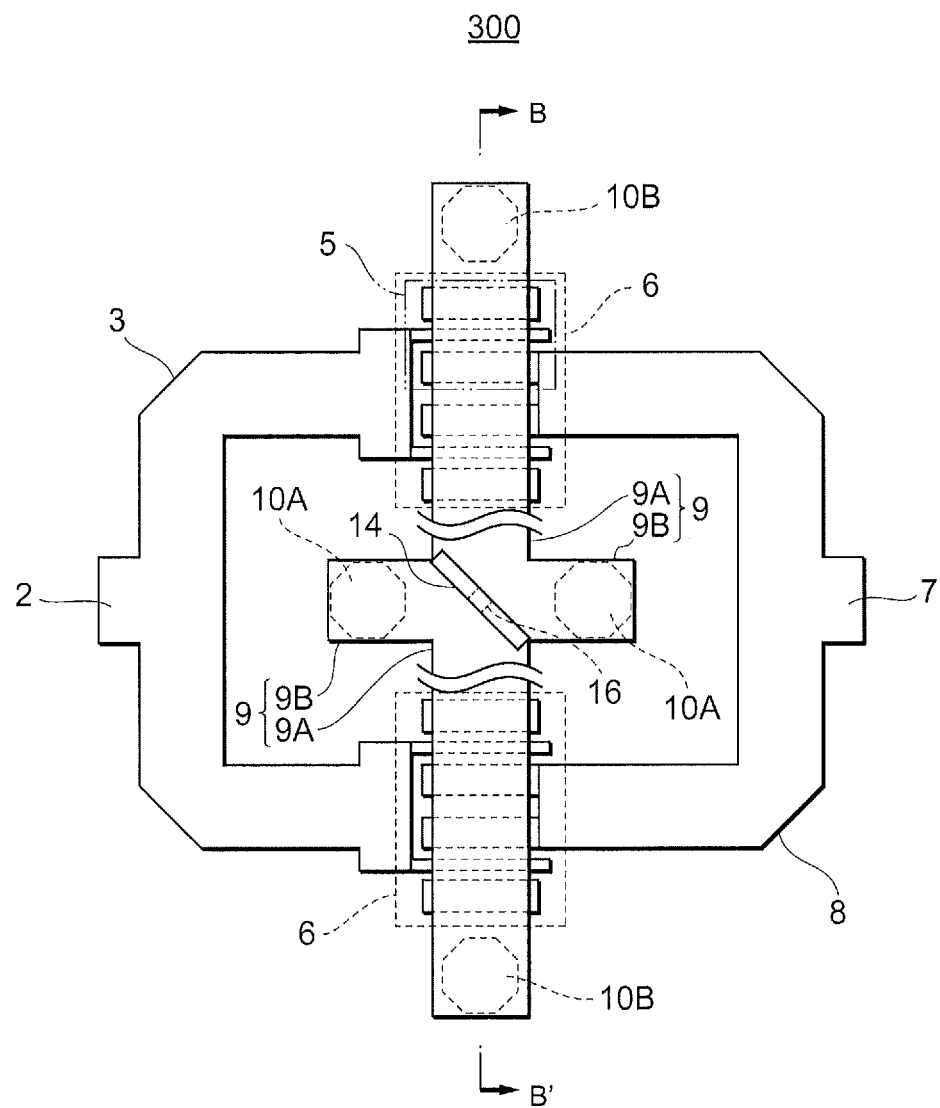
FIG. 4 is a diagram illustrating the layout of a high-frequency amplifier according to a third embodiment.
Figure 5:
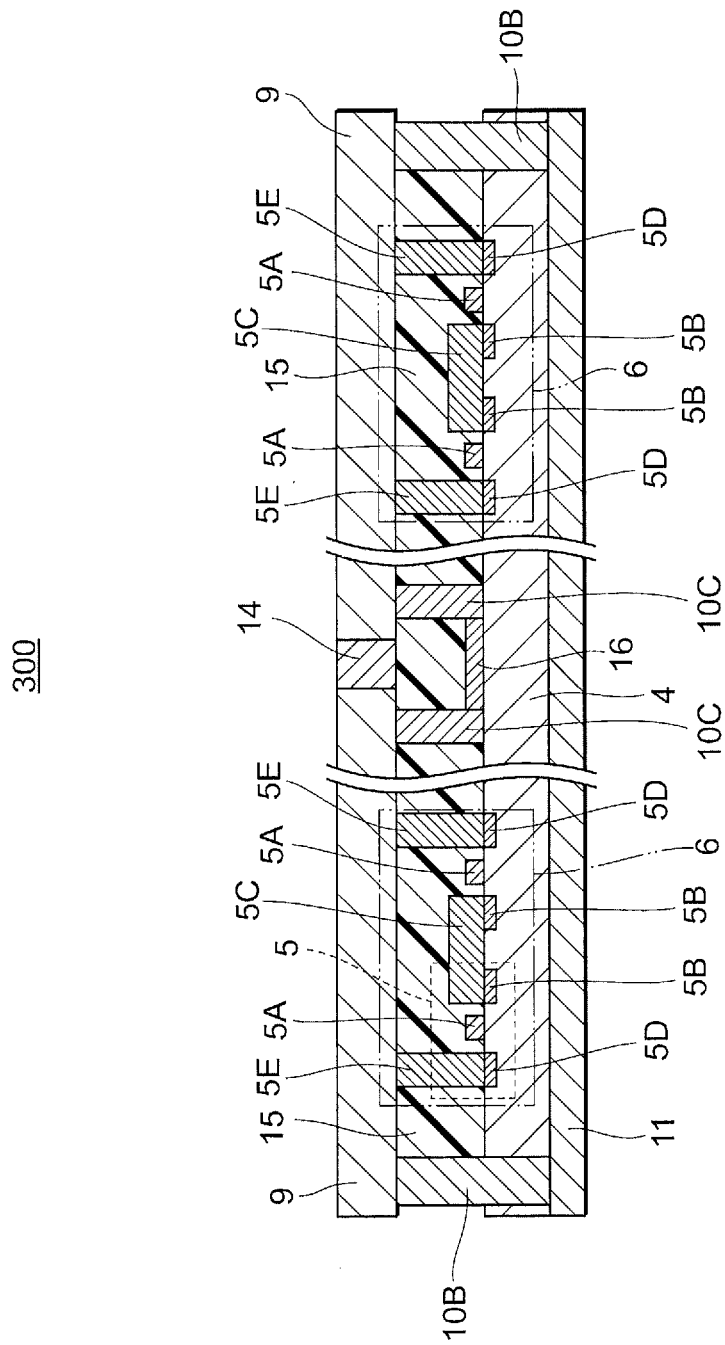
FIG. 5 is a cross-sectional view taken along the line B-B' of FIG. 4.

In the third embodiment, a configuration part different from that described in the first embodiment will be described. More specifically, a high-frequency amplifier 300 according to the third embodiment includes in parallel with the slot 14 a resistance element 16 connected between the two conductor patterns 9 that are connected to the corresponding adjacent amplifiers 6. The adjacent amplifiers 6 are connected to each other via the conductor patterns 9 and the resistance element 16. FIG. 4 is a diagram illustrating the top view of a layout of the high-frequency amplifier 300. FIG. 5 is a cross-sectional view taken along the line B-B' of FIG. 4. As illustrated in FIGS. 4 and 5, the resistance element 16 is disposed on the lower layer of the slot 14 (the upper surface of the base substrate 4) and is connected via vias 10C to the two conductor patterns 9 that are connected to the corresponding adjacent amplifiers 6. The resistance element 16 may not be disposed directly below the slot 14 as long as in parallel with the slot 14 the resistance element 16 is connected. The resistance value of the resistance element 16 is set as appropriate in accordance with the magnitude of a high-frequency signal that returns to the ground ends of the amplifiers 6.

The operation of the high-frequency amplifier 300 will be described. Since in parallel with the slot 14 the resistance element 16 is connected between the two conductor patterns 9 that are connected to the corresponding adjacent amplifiers 6, the resistance element 16 is present on an oscillation loop path between the amplifiers 6. Accordingly, a high-frequency signal flowing through the oscillation loop path between the amplifiers 6 passes through the resistance element 16. As a result, the high-frequency signal flowing through the oscillation loop path between the amplifiers 6 is attenuated at the resistance element 16 and the occurrence of loop oscillation can be prevented for high-frequency signals in all frequency ranges.

Fourth Embodiment

Figure 6:
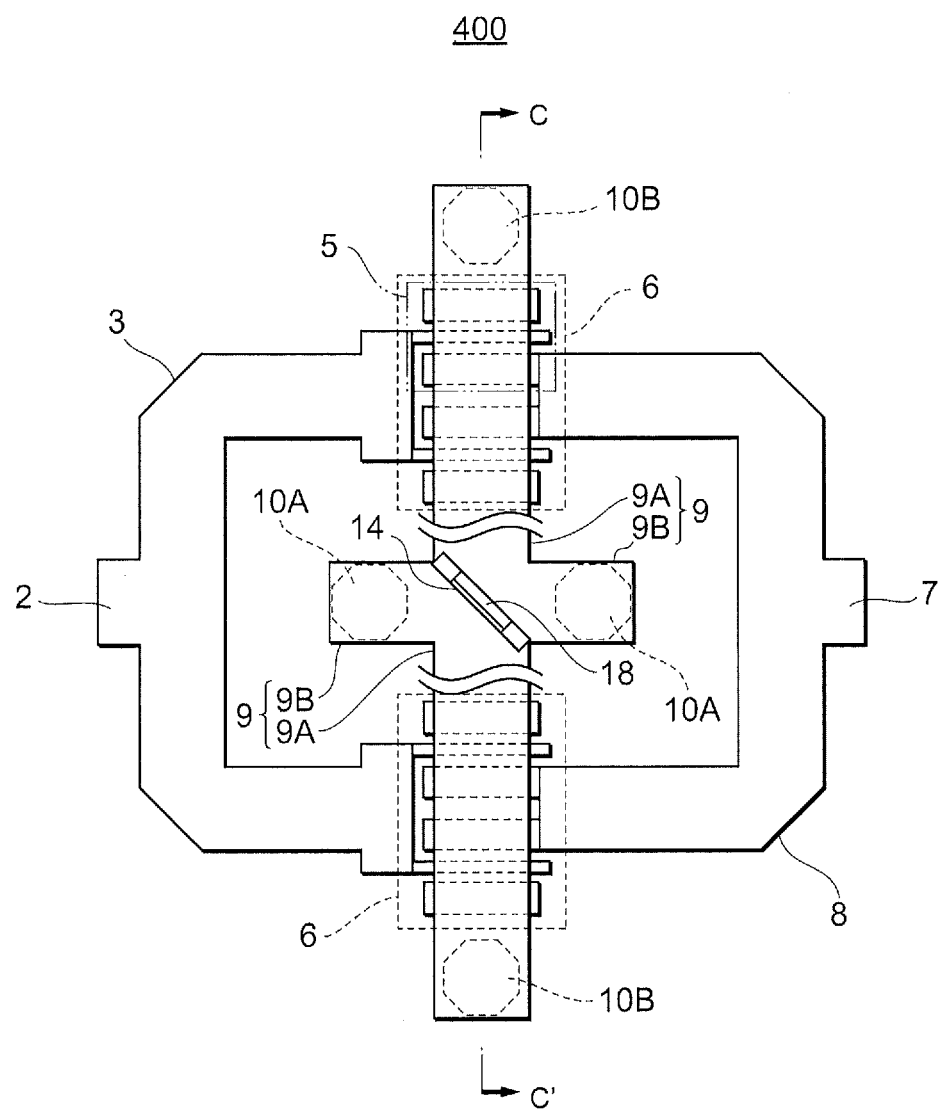
FIG. 6 is a diagram illustrating the layout of a high-frequency amplifier according to a fourth embodiment.
Figure 7:
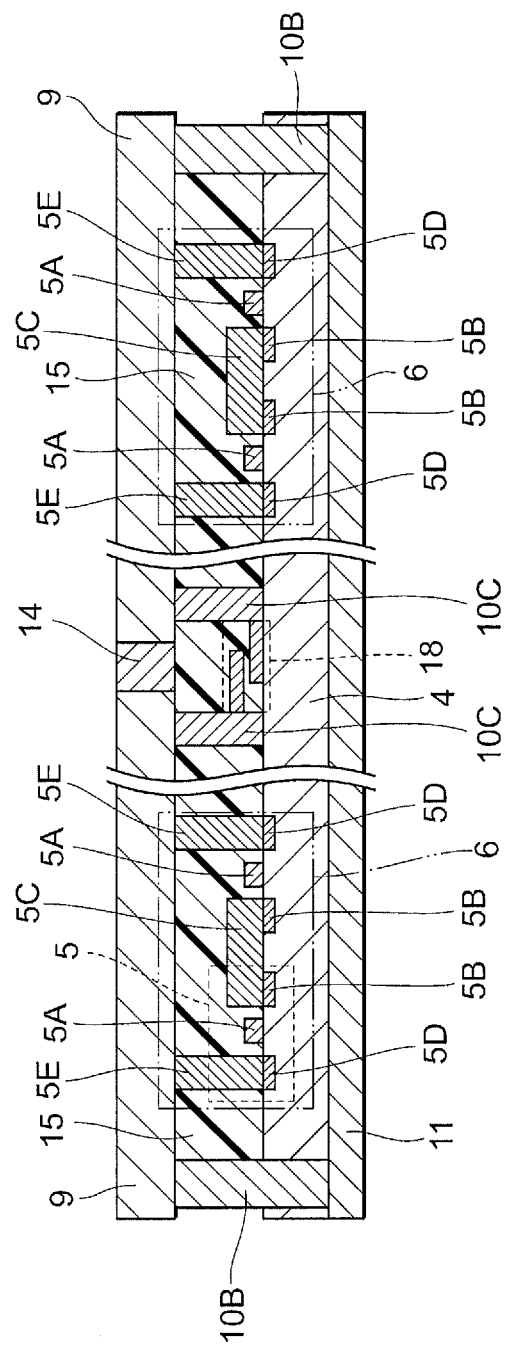
FIG. 7 is a cross-sectional view taken along the line C-C' of FIG. 6.

In the fourth embodiment, a configuration part different from that described in the first embodiment will be described. More specifically, a high-frequency amplifier 400 according to the fourth embodiment includes in parallel with the slot 14 a resonance circuit 18 connected between the two conductor patterns 9 that are connected to the corresponding adjacent amplifiers 6. The adjacent amplifiers 6 are connected to each other via the conductor patterns 9 and the resonance circuit 18. FIG. 6 is a diagram illustrating the top view of a layout of the high-frequency amplifier 400. FIG. 7 is a cross-sectional view taken along the line C-C' of FIG. 6. As illustrated in FIGS. 6 and 7, the resonance circuit 18 is disposed on the lower layer of the slot 14 and is connected via the vias 100 to the two conductor patterns 9 that are connected to the corresponding adjacent amplifiers 6. The resonance circuit 18 forms a low-pass filter and attenuates a harmonic component in a high-frequency signal used. The resonance circuit 18 may not be disposed directly below the slot 14 as long as in parallel with the slot 14 the resonance circuit 18 is connected.

The operation of the high-frequency amplifier 400 will be described. Since in parallel with the slot 14 the resonance circuit 18 is connected between the two conductor patterns 9 that are connected to the corresponding adjacent amplifiers 6, the resonance circuit 18 is present on an oscillation loop path between the amplifiers 6. Accordingly, a high-frequency signal flowing through the oscillation loop path between the amplifiers 6 passes through the resonance circuit 18. When high-frequency signals are amplified by the amplifiers 6, harmonics are generated. However, since the resonance circuit 18 forms a low-pass filter, a harmonic component in the high-frequency signal flowing through the oscillation loop path between the amplifiers 6 can be attenuated. As a result, the occurrence of loop oscillation due to a harmonic component in a high-frequency signal used can be prevented.

Fifth Embodiment

In the fifth embodiment, a configuration part different from that described in the fourth embodiment will be described. More specifically, in a high-frequency amplifier according to the fifth embodiment, the resonance circuit 18 in the high-frequency amplifier 400 according to the fourth embodiment forms a notch filter. The resonance point of the notch filter is the frequency of a high-frequency signal used. The resonance circuit 18 preferably forms a notch filter including, for example, a resonator for resonating an L and a C in parallel.

The operation of a high-frequency amplifier according to the fifth embodiment will be described. Since in parallel with the slot 14 the resonance circuit 18 is connected between the two conductor patterns 9 that are connected to the corresponding adjacent amplifiers 6, the resonance circuit 18 is present on an oscillation loop path between the amplifiers 6. Accordingly, a high-frequency signal flowing through the oscillation loop path between the amplifiers 6 passes through the resonance circuit 18. The resonance circuit 18 forms a notch filter, and the resonance point of the notch filter is the frequency of a high-frequency signal used.

Accordingly, a frequency component in the high-frequency signal used is attenuated by the resonance circuit 18. As a result, the occurrence of loop oscillation due to a frequency component in a high-frequency signal used can be further prevented.

Sixth Embodiment

In the sixth embodiment, a configuration part different from that described in the first embodiment will be described. More specifically, in a high-frequency amplifier according to the sixth embodiment, the inside of the slot 14 is filled with an insulating material with a dielectric constant lower than that of the insulating material 15 used around the slot 14. The insulating material with which the inside of the slot 14 is filled is preferably an insulating material with a dielectric constant of 3.0 or less, for example, a Low-k material. By filling the inside of the slot 14 with an insulating material of a low dielectric constant, the level of insulation against a high-frequency signal flowing through the oscillation loop path between the amplifiers is increased and the high-frequency signal does not pass through the slot 14. As a result, the occurrence of loop oscillation can be further prevented. In addition, by filling the inside of the slot 14 with an insulating material of a low dielectric constant, a wavelength-shortening effect acts and the width of the slot 14 can be reduced. As a result, the size reduction of a high-frequency amplifier can be achieved.

Exemplary Simulation

Figure 8:
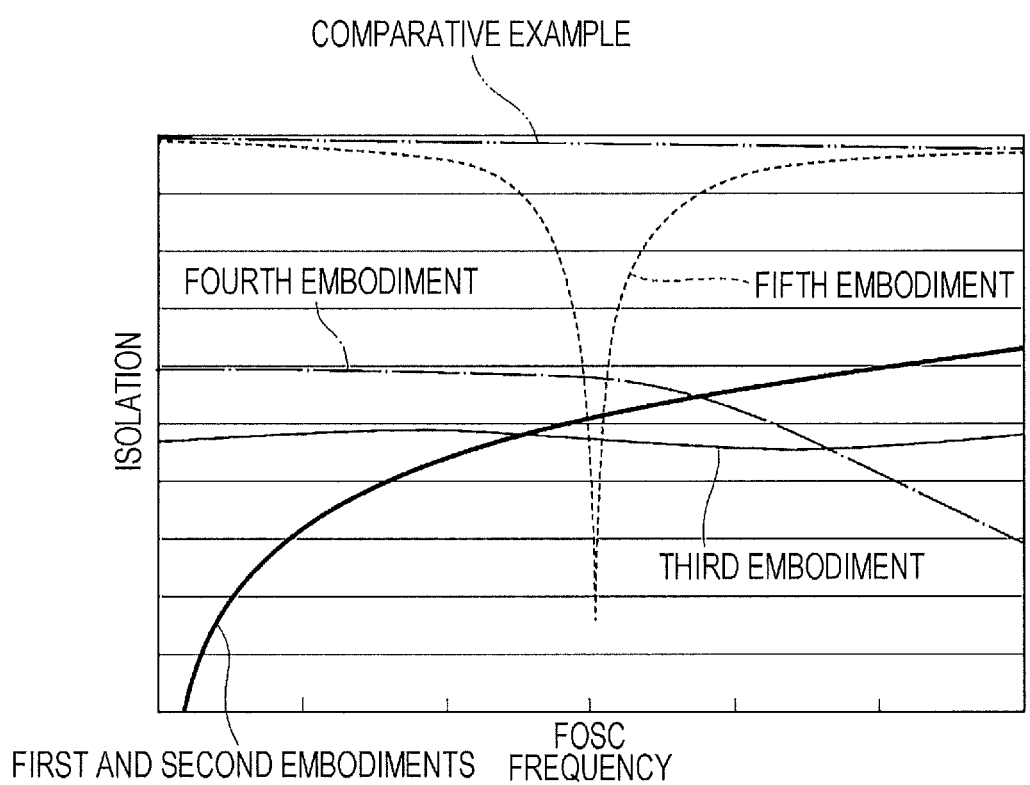
FIG. 8 is a diagram illustrating results of exemplary simulations.
Figure 9:
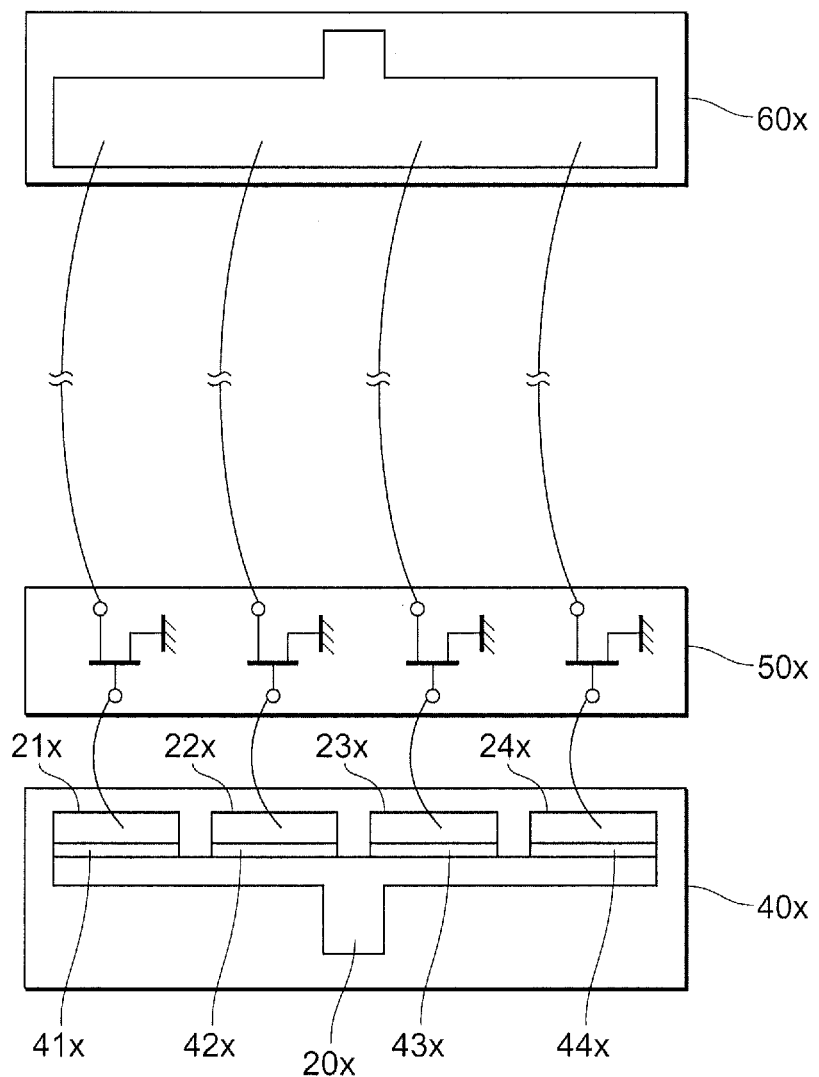
FIG. 9 is a schematic diagram of a high-frequency amplifier in the related art.

Simulations of the isolation between the adjacent amplifiers 6 were performed on high-frequency amplifiers according to the first to fifth embodiments and a high-frequency amplifier that is a comparative example and has the same configuration as that of the high-frequency amplifier 1 according to the first embodiment except for the elimination of the slot 14 using an Advanced Design System (ADS) of Agilent Technologies. Results of the simulations are illustrated in FIG. 8. ADS ideal elements were individually used for the resistance element 16 and the resonance circuit 18. Referring to FIG. 8, fosc indicates the frequency of a high-frequency signal used.

Since the slot 14 is not present in the comparative example, the isolation is poor over the entire frequency band and it is apparent from the result that loop oscillation easily occurs. In the first and second embodiments in which a slot is formed, the isolation is achieved particularly in a low frequency band. In the third embodiment, the isolation is achieved on average over the entire frequency band. In the fourth embodiment, the isolation is good particular in a high frequency band and it is apparent from the result that harmonics can be attenuated in particular. In the fifth embodiment, a specific frequency component, that is, a component of the fosc, can be attenuated. It is apparent from the result that the occurrence of loop oscillation due to a frequency component in a high-frequency signal used can be prevented.

Simulation results according to the first to fifth embodiments have been described. The methods of preventing the occurrence of loop oscillation in a high-frequency amplifier can be used as appropriate in these embodiments in accordance with a use or a purpose.

As described previously, a high-frequency amplifier according to the present invention can be used as an amplifier in, for example, a radio communication apparatus.

REFERENCE SIGNS LIST 1, 300, and 400 high-frequency amplifier
2 input end
3 divider
4 base substrate
5 transistor
6 amplifier
7 output end
8 combiner
9 conductor pattern
10A, 10B, and 100 via
11 ground electrode
14 slot
15 insulating material
16 resistance element
18 resonance circuit

What is claimed is:
1. A high-frequency amplifier comprising:
a divider for distributing an input high-frequency signal;
a plurality of parallel-connected amplifiers for amplifying a high-frequency signal distributed by the divider and outputting the amplified high-frequency signal;
a combiner for combining high-frequency signals amplified by the amplifiers;
a substrate on which the amplifiers are disposed;
a conductor pattern connected to a ground end of each of the amplifiers; and
a ground electrode,
wherein the conductor pattern has a first conductive portion extending in a direction in which the amplifiers are adjacent to each other,
wherein a slot is disposed between two conductor patterns connected to corresponding adjacent ones of the amplifiers,
wherein, between the adjacent amplifiers, two vias passing through the substrate are formed so that the slot is sandwiched between the vias,
wherein one of the two conductor patterns connected to the corresponding adjacent amplifiers is connected to the ground electrode via one of the two vias, and the other one of the two conductor patterns connected to the corresponding adjacent amplifiers is connected to the ground electrode via the other one of the two vias, and
wherein a length of the slot is substantially equal to or less than a half-wavelength of a high-frequency signal used.
2. The high-frequency amplifier according to claim 1,
wherein the conductor pattern has, between the adjacent amplifiers, a second conductive portion extending in a direction different from the direction in which the first conductive portion extends,
wherein the second conductive portions of the two conductor patterns connected to the corresponding adjacent amplifiers extend in directions away from each other, and
wherein the second conductive portion is connected to one of the two vias.
3. The high-frequency amplifier according to claim 1, further comprising in parallel with the slot a resistance element connected between the two conductor patterns connected to the corresponding adjacent amplifiers, and
wherein the adjacent amplifiers are connected to each other via the conductor patterns and the resistance element.

4. A high-frequency amplifier comprising:
a divider for distributing an input high-frequency signal;
a plurality of parallel-connected amplifiers for amplifying a high-frequency signal distributed by the divider and outputting the amplified high-frequency signal;
a combiner for combining high-frequency signals amplified by the amplifiers;
a substrate on which the amplifiers are disposed;
a conductor pattern connected to a ground end of each of the amplifiers;
in parallel with a slot, resonance circuit connected between the two conductor patterns connected to the corresponding adjacent amplifiers; and
a ground electrode,
wherein the conductor pattern has a first conductive portion extending in a direction in which the amplifiers are adjacent to each other,
wherein the slot is disposed between two conductor patterns connected to corresponding adjacent ones of the amplifiers,
wherein, between the adjacent amplifiers, two vias passing through the substrate are formed so that the slot is sandwiched between the vias,
wherein one of the two conductor patterns connected to the corresponding adjacent amplifiers is connected to the ground electrode via one of the two vias, and the other one of the two conductor patterns connected to the corresponding adjacent amplifiers is connected to the ground electrode via the other one of the two vias,
wherein the adjacent amplifiers are connected to each other via the conductor patterns and the resonance circuit, and
wherein the resonance circuit forms a low-pass filter.

5. A high-frequency amplifier comprising:
a divider for distributing an input high-frequency signal;
a plurality of parallel-connected amplifiers for amplifying a high-frequency signal distributed by the divider and outputting the amplified high-frequency signal;
a combiner for combining high-frequency signals amplified by the amplifiers;
a substrate on which the amplifiers are disposed;
a conductor pattern connected to a ground end of each of the amplifiers;
in parallel with a slot, a resonance circuit connected between the two conductor patterns connected to the corresponding adjacent amplifiers; and
a ground electrode,
wherein the conductor pattern has a first conductive portion extending in a direction in which the amplifiers are adjacent to each other,
wherein the slot is disposed between two conductor patterns connected to corresponding adjacent ones of the amplifiers,
wherein, between the adjacent amplifiers, two vias passing through the substrate are formed so that the slot is sandwiched between the vias,
wherein one of the two conductor patterns connected to the corresponding adjacent amplifiers is connected to the ground electrode via one of the two vias, and the other of the two conductor patterns connected to the corresponding adjacent amplifiers is connected to the ground electrode via the other one of the two vias,
wherein the adjacent amplifiers are connected to each other via the conductor patterns and the resonance circuit,
wherein the resonance circuit forms a notch filter, and
wherein a resonance point of the notch filter is a frequency of a high-frequency signal used.

6. A high-frequency amplifier comprising:
a divider for distributing an input high-frequency signal;
a plurality of parallel-connected amplifiers for amplifying a high-frequency signal distributed by the divider and outputting the amplified high-frequency signal;
a combiner for combining high-frequency signals amplified by the amplifiers;
a substrate on which the amplifiers are disposed;
a conductor pattern connected to a ground end of each of the amplifiers; and
a ground electrode,
wherein the conductor pattern has a first conductive portion extending in a direction in which the amplifiers are adjacent to each other,
wherein a slot is disposed between two conductor patterns connected to corresponding adjacent ones of the amplifiers,
wherein, between the adjacent amplifiers, two vias passing through the substrate are formed so that the slot is sandwiched between the vias,
wherein one of the two conductor patterns connected to the corresponding adjacent amplifiers is connected to the ground electrode via one of the two vias, and the other one of the two conductor patterns connected to the corresponding adjacent amplifiers is connected to the ground electrode via the other one of the two vias, and
wherein an insulating material with which an inside of the slot is filled has a dielectric constant lower than that of an insulating material used around the slot.

7. The high-frequency amplifier according to claim 4,
wherein the conductor pattern has, between the adjacent amplifiers, a second conductive portion extending in a direction different from the direction in which the first conductive portion extends,
wherein the second conductive portions of the two conductor patterns connected to the corresponding adjacent amplifiers extend in directions away from each other, and
wherein the second conductive portion is connected to one of the two vias.

8. The high-frequency amplifier according to claim 4, further comprising in parallel with the slot a resistance element connected between the two conductor patterns connected to the corresponding adjacent amplifiers, and
wherein the adjacent amplifiers are connected to each other via the conductor patterns and the resistance element.

9. The high-frequency amplifier according to claim 5,
wherein the conductor pattern has, between the adjacent amplifiers, a second conductive portion extending in a direction different from the direction in which the first conductive portion extends,
wherein the second conductive portions of the two conductor patterns connected to the corresponding adjacent amplifiers extend in directions away from each other, and
wherein the second conductive portion is connected to one of the two vias.

10. The high-frequency amplifier according to claim 5, further comprising in parallel with the slot a resistance element connected between the two conductor patterns connected to the corresponding adjacent amplifiers, and wherein the adjacent amplifiers are connected to each other via the conductor patterns and the resistance element.

11. The high-frequency amplifier according to claim 6,
wherein the conductor pattern has, between the adjacent amplifiers, a second conductive portion extending in a direction different from the direction in which the first conductive portion extends,
wherein the second conductive portions of the two conductor patterns connected to the corresponding adjacent amplifiers extend in directions away from each other, and
wherein the second conductive portion is connected to one of the two vias.

12. The high-frequency amplifier according to claim 6, further comprising in parallel with the slot a resistance element connected between the two conductor patterns connected to the corresponding adjacent amplifiers, and
wherein the adjacent amplifiers are connected to each other via the conductor patterns and the resistance element.

* * * * *